United States Patent [19]
Millar

[11] Patent Number: 5,945,886
[45] Date of Patent: Aug. 31, 1999

[54] HIGH-SPEED BUS STRUCTURE FOR PRINTED CIRCUIT BOARDS

[75] Inventor: Bruce Millar, Stittsville, Canada

[73] Assignee: Sldram, Inc., Palo Alto, Calif.

[21] Appl. No.: 08/933,710

[22] Filed: Sep. 19, 1997

Related U.S. Application Data

[60] Provisional application No. 60/026,894, Sep. 20, 1996.

[51] Int. Cl.[6] ..................................... H03H 7/48
[52] U.S. Cl. ................... 333/1; 174/250; 326/30; 333/124; 333/127; 375/257
[58] Field of Search ................ 333/1.22 R, 100, 333/124, 127, 136; 174/250, 253–255; 361/794, 795; 375/257; 307/147; 326/30

[56] References Cited

U.S. PATENT DOCUMENTS

| | | | |
|---|---|---|---|
| 4,988,890 | 1/1991 | Narhi et al. | 333/100 X |
| 5,027,088 | 6/1991 | Shimizu et al. | 333/1 |
| 5,457,406 | 10/1995 | Takada et al. | 333/22 R X |
| 5,578,940 | 11/1996 | Dillon et al. | 326/30 |
| 5,675,298 | 10/1997 | Bhagwan et al. | 333/1 |

*Primary Examiner*—Paul Gensler
*Attorney, Agent, or Firm*—Fliesler, Dubb, Meyer & Lovejoy

[57] ABSTRACT

The present invention provides for high speed signal buses in printed circuit boards. For high speed operation, each signal line of a bus has substantially the same electrical length as the other signal lines and forms a loop in two halves, each half electrically shielded from the other half. Each signal line has a first and a second terminal, with each terminal connected to a reference bias voltage through a first resistance which matches a loaded characteristic impedance of the signal line. The reference bias voltage is set at a midpoint of signal voltage swings on the signal line. Such high speed buses have particular applications to high speed memory systems with DRAMs.

16 Claims, 3 Drawing Sheets

HIGH-SPEED BUS STRUCTURE FOR PRINTED CIRCUIT BOARDS

CROSS REFERENCE TO RELATED APPLICATIONS

This application claims priority from the following U.S. Provisional Applications, each of which, including all appendices and attached documents, are incorporated by reference in their entirety for all purposes:

Application Serial No. 60/026,894, filed Sep. 20, 1996, entitled "SyncLink Bus Structure";

Application Serial No. 60/055,349, filed Aug. 11, 1997, entitled "SLDRAM Architecture"; and, Application Serial No. 60/057,092, filed Aug. 27, 1997, entitled "SLDRAM Architecture."

The following copending U.S. patent applications are hereby incorporated by reference in their entirety for all purposes:

Application Ser. No. 08/909,299, filed Aug. 11, 1997, entitled "Bifurcated Data and Command/address Communication Bus Architecture for Random Access Memories Employing Synchronous Communication Protocols";

Application Ser. No. 08/055,368, filed Aug. 11, 1997, entitled "A High-Speed Memory Interface (SyncLink)";

Application Ser. No. 08/933,673, filed Sep. 19, 1997, entitled "Read/Write Timing for Maximum Utilization of Bi-Directional Read/Write Bus" by Peter B. Gillingham; and Application Ser. No. 08/933,713, filed Sep. 19, 1997, entitled "De-Skewing Data Signals in a Memory System" by Bruce Millar.

BACKGROUND OF THE INVENTION

The present invention is related to printed circuit board technology and, more particularly, to bus structures for high speed operations with integrated circuits, particularly dynamic random access memory (DRAM) circuits, mounted on the printed circuit board.

Electronic systems are typically formed by integrated circuits mounted on printed circuit boards. The integrated circuits are interconnected by parallel signal line traces, called a bus, formed in or on the printed circuit board substrate which is formed from electrically insulating material, such as resin. If more than one board is required for the system, the signal lines on the board are connected to end tabs by which several printed circuit boards may be electrically interconnected to form a complete system. A common example of an electronic system with one or more printed circuit boards is a personal computer which has a mother board holding the microprocessor and other integrated circuits. Other circuit boards may be connected to the mother board to form the complete system.

In all electronic systems, high speed operation is desirable. However, high speed operation is not only limited by the operational speed of the constituent integrated circuits, but also by the fundamental characteristics of the printed circuit board buses over which the integrated circuits communicate. The characteristics include the raw bandwidth capability of the bus, the propagation delay of a signal from a driving component to a receiving component, signal integrity, noise immunity, skew, and so on.

The present invention is directed toward the achievement of a fast, robust bus structure on a printed circuit board for integrated circuits, particularly, dynamic RAMs.

SUMMARY OF THE INVENTION

The present invention provides for a signal bus in a printed circuit board having a plurality of substantially parallel signal lines. Each signal line has substantially the same electrical length as the other signal lines and forms a loop in two halves, each half electrically shielded from the other half. Furthermore, each signal line has a first and second terminal, each terminal connected to a reference bias voltage through a first resistance.

DETAILED DESCRIPTION OF SPECIFIC EMBODIMENTS

Figure 1:
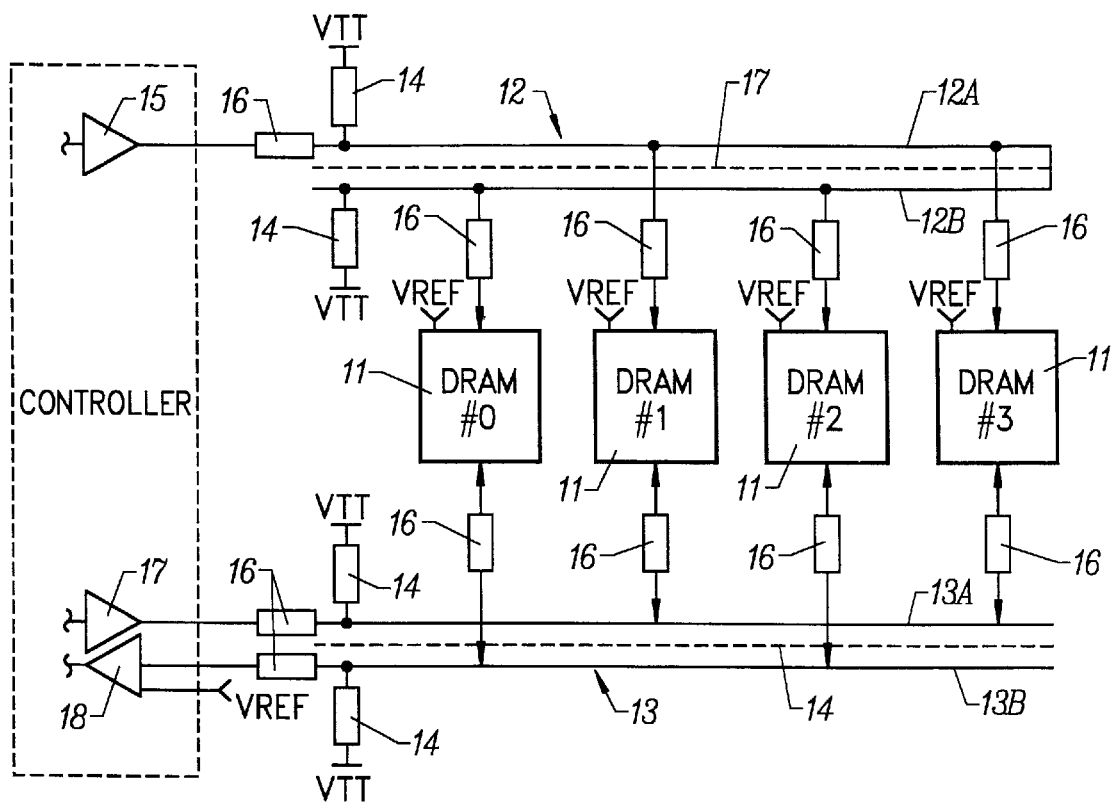
FIG. 1 is a representational drawing of a signal line bus structure interconnecting a memory controller and several DRAM devices on a printed circuit, according to one embodiment of the present invention.

FIG. 1 is a representation of a high speed bus structure according to the present invention. Two representative signal lines 12 and 13 interconnect a memory controller integrated circuit 10 with four DRAM integrated circuits 11. The signal line 12 represents a bus carrying one-way signals, i.e., signals from the controller 10 to the DRAMs 11. Typically such signals are control signals. An amplifier 15 in the controller 10 illustrates that the controller drives signals onto the signal line 12. The signal line 13 represents a bus in which the signals are bi-directional. An amplifier 17 illustrates how the controller 10 drives signals of the bus represented by the signal line 13 to the DRAMs 11. An amplifier 18 represents a controller buffer circuit which receives signals from the DRAMs 11 for the controller 10. Typical signals which are passed between the controller 10 and the DRAMs 11 are data signals.

To achieve high speed operation, the signal lines 12 and 13 of the buses are electrically the same length. Each of the signal lines are also double-terminated, that is, each terminus of a signal line 12 or 13, is electrically connected to a bias voltage, VTT, through a resistance 14. The bias VTT is set at the mid-point of the voltage swing of signals carried on the signal lines 12 and 13. The value of the line termination resistor 14 is selected to match the loaded characteristic impedance, Zo', of the signal line 12 or 13. It should be noted that Zo, the unloaded characteristic impedance, is distinguished from the loaded characteristic impedance, Zo', of the line. For the case where stub tap intervals on the line are small relative to the rise time of the signal, Zo and Zo' are related (approximately) by the equation:

$$Zo' = (Zo * Zo\_stub)/(Zo + Zo\_stub)$$

where Zo is the unloaded characteristic impedance of the line and Zo_stub is the unloaded characteristic impedance of the stubs connected to the line. Good line performance can be achieved by setting the resistance 14, which terminates a signal line, at Zo'. In typical applications where line and stub characteristic impedances are the same, the loaded line impedance can be approximated by:

$$Zo'=Zo/2.$$

Since there is no ideal line termination for a tapped transmission line, circuit trials or simulations can be used to select a termination resistance 14 value which produces a better signal-to-noise margin than obtainable with the Zo' resistance value.

Figure 3A:
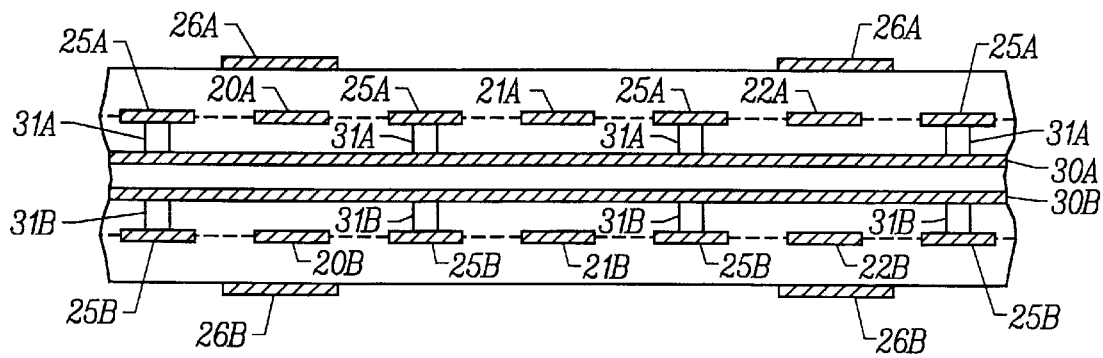
FIG. 3A is a cross-sectional side view of a printed circuit with one arrangement of signal line traces according to the present invention.
Figure 3B:
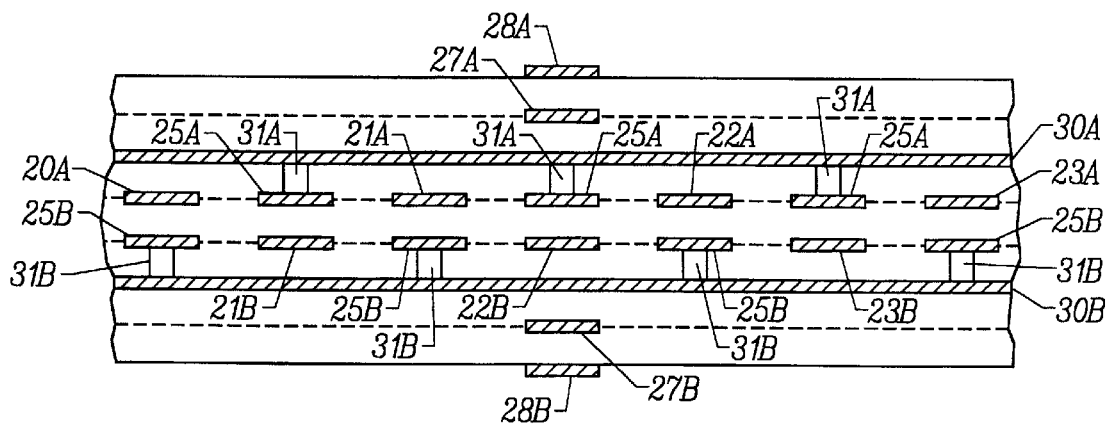
FIG. 3B is a cross-sectional side view of a printed circuit with another arrangement of signal line traces according to the present invention.

Each signal line of the high speed buses is also formed into a loop in which the second half of the signal line returns in a different physical plane than that of the first half of the loop. As illustrated in FIG. 1, each signal line 12 and 13 is shown with two loop halves 12A and 12B, 13A and 13B. One half of a bus which is represented by the signal line half 12A, for example, is in one plane on a printed circuit board and the second half of the bus represented by the signal line half 12B returns on another plane of the circuit board. Examples of different looping line structures are illustrated in FIGS. 3A and 3B, which are described in detail below. The insulating materials between each plane of signal lines act as an isolating shield to prevent two halves of a signal line from directly coupling through the terminals of the signal line.

Figure 2:
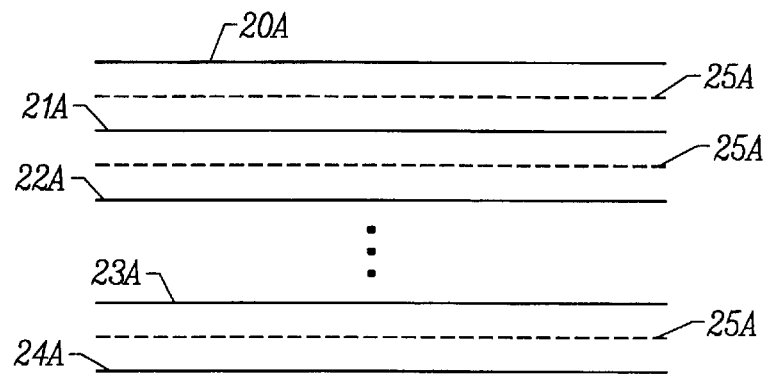
FIG. 2 is a representational top view of a printed circuit board with a bus having signal line traces interleaved with AC grounded lines, according to an embodiment of the present invention.

Additionally, cross-talk between adjacent signal lines 12 and 13 is substantially avoided by isolation between the signal lines. The signal lines 12 and 13 are interleaved with lines 19 referenced to an AC ground potential, that is, connected to one of the power planes, say at VCC or VSS supply voltages, of the printed circuit board. FIG. 2 shows a top view of a plane of signal line loop halves 20A–24A, which form part of a bus. AC grounded lines 25A are interleaved between the signal line loop halves 20A–24A.

FIGS. 3A and 3B are cross-sectional side views of a printed circuit board for an application in which the integrated circuits are dual-in-line memory modules (DIMM) and an application for a computer mother board, respectively. The conducting lines are shown by hatched lines, while the dashed lines illustrate the multilayer nature of a printed circuit board. The cross-sectional view in FIG. 3A illustrates the loop-back feature of the signal lines. Hence the cross-section of signal line loop half 20A has a corresponding cross-section of the signal line loop half 20B. Likewise, the signal line loop half 21A has a cross-section of the signal line loop half 21B, signal line loop half 22A has its corresponding signal line loop half 22B, and so on. In the plane of each loop half of the signal lines 20A–22A and 20B–22B there are interleaved lines 25A and 25B respectively. As explained above, these interleaved lines 25A and 25B, which are AC grounded, prevent cross-talk between adjacent signal lines. Each of the signal lines 25A are connected by vias 31A to a power plane 30. Likewise, the lines 25B are connected by vias 31B to a similar power plane 30B. Conductive traces 26A make connections and mount components, including integrated circuits, on the top of the printed circuit board. Traces 26B are likewise formed on the bottom of the printed circuit board.

The printed circuit board of FIG. 3B has a more complex structure of 8 layers than that of the FIG. 3A printed circuit board. The power planes 30A and 30B are on outside planes of the signal lines 20A–23A and 20B(which is not shown) –23B planes. The signal lines loop back to form two looping halves, but each loop half is not directly opposite its complementary half. The signal line loop halves 20A–23A are staggered with respect to their complementary loop halves 21B–23B. For example, the signal line loop half 21A is staggered with respect to its complementary loop half 21B. In the plane of each loop halves, there are also the AC grounded lines 25A and 25B which are interleaved with the signal lines. Conductive traces 27A and 28A represent conducting lines at different levels of the printed circuit board on the top side of the board, while traces 27B and 28B represent conducting patterns on the lower half.

Returning to FIG. 1, it should be noted that each integrated circuit is connected to a signal line through a resistor 16. The resistor 16 provides isolation for the bus signal lines from the relatively long conductive stubs between each signal line and the integrated circuit. The isolation improves bandwidth and noise margins. To be effective, the resistor 16 should be located as close as possible to the bus signal line to minimize the wire length between the resistor and tap (connection) point to the bus signal line. Besides isolation, another benefit of these stub resistors is the reduction in power dissipated in the drivers on the integrated circuits which drive the signal lines.

Figure 4A:
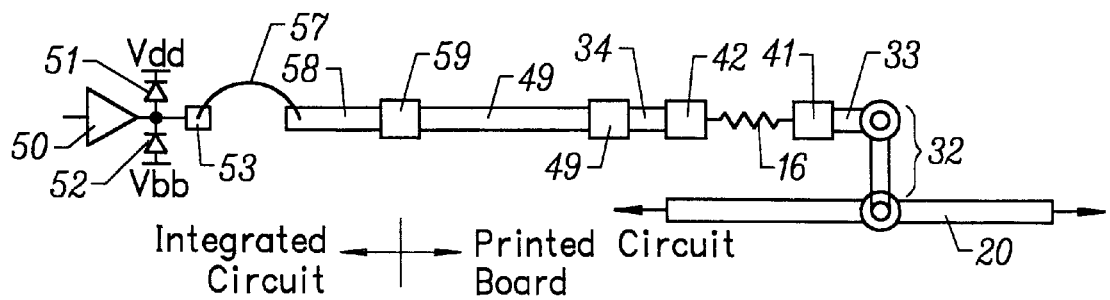
FIG. 4A is a representational drawing of a stub interconnecting a surface mount integrated circuit to a signal line trace according to the present invention.
Figure 4B:
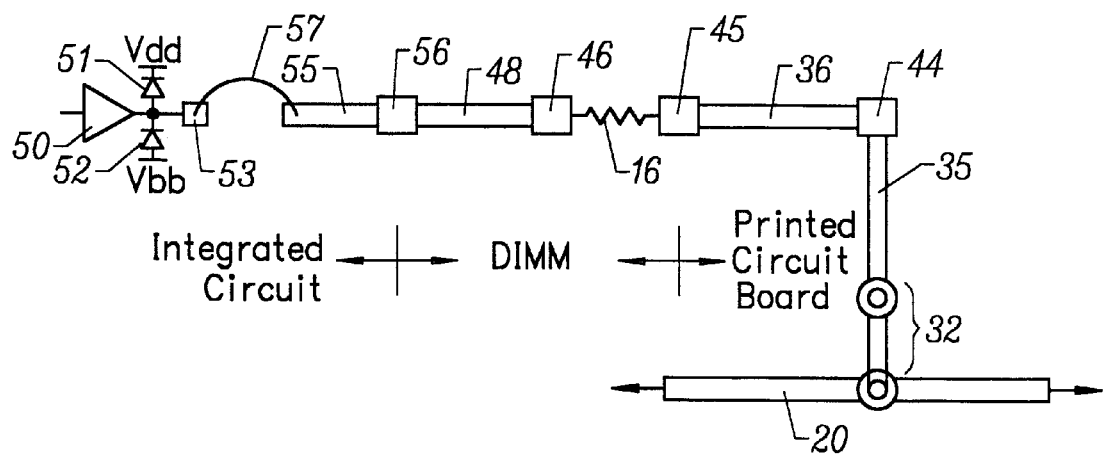
FIG. 4B is a representational drawing of a stub interconnecting a dual-in line memory module to a signal line trace, according to the present invention.

FIGS. 4A and 4B detail this aspect of the present invention, with different integrated circuit packages. In FIG. 4A the integrated circuit (and its protective package) is plugged into a connector on a mother board. A signal line 20 represents part of a high speed bus on one plane of the printed circuit board. Through a via 32, an electrical connection is made to a second printed circuit board plane in which the integrated circuits are mounted. A signal line trace 33 leads from the via 32 to one of two solder lands 41 and 42, between which the isolating resistor 16 is fixed. The second solder land 42 is connected to a signal line trace 34 which leads to a third solder land 43 which is fixed to the connector to hold the integrated circuit and its package. The connector is represented in FIG. 4A by a signal line trace 49 which is connected to the solder lands 43.

The integrated circuit itself is represented by a driver circuit 50, which is connected to a bonding pad 53. Two diodes 51 and 52, which are respectively connected to power supply voltages Vdd, Vbb, and represent the drain junction capacitance of the driver circuit 50, are connected to the output terminal of the driver circuit 50 and the pad 53. The integrated circuit package is represented by a bonding wire 57 connected at one end to the bonding pad 53. The other end of the bonding wire 57 is connected to one end of a conductive lead 58 of the integrated circuit package. The other end of the conductive lead 58 is connected to a package pin 59 which makes the physical and electrical connection to the printed circuit board connector, which is represented by the signal line trace 49 in FIG. 4A. Here the stub length, the distance from the signal line 20 to the bonding pad 53 is typically 2 cm.

FIG. 4B illustrates a longer stub length. The integrated circuit is packaged in a DIMM. The signal line 20 on a printed circuit board is connected by the via 32 to a signal line trace 35 which ends with solder land 44 to hold a connector for the DIMM. Electrically, the DIMM connector is represented by a trace 36. In this case the isolating resistor 16 is located on the DIMM. It is placed between two connections 45 and 46. The connection 45 is connected to the trace 36. The connection 46 is connected to a DIMM representative trace 48. The other end of the DIMM trace 48 is connected to a connector 56 which is also connected to one end of a lead 55. As described above, the integrated circuit itself is connected to the other end of the lead 55 by the bonding wire 57. The stub length in this example is approximately 4 cm. and the resistor is located about halfway between the bonding pad 53 and the signal line 20.

Acceptable values for the isolating resistors 16 range from 20 to 30 ohms with 25 ohms being typical. Surface-mount chip resistors are used to implement these resistors, as well as the line termination resistors described above, because of their low reactance characteristics.

While the foregoing is a complete description of the embodiments of the invention, various modifications, alternatives and equivalents may be used. Accordingly, the above description should not be taken as limiting the scope of the invention which is defined by the metes and bounds of the appended claims.

What is claimed is:

1. In a printed circuit board, a signal bus comprising:

a plurality of substantially parallel signal lines on said printed circuit board, each signal line having substantially the same electrical length as the other signal lines and forming a loop in two halves, each signal line further having first and second terminals, each terminal connected to a reference bias voltage through a first resistance, wherein said printed circuit board defines a principal plane, each half of each signal line disposed in a plane displaced from, but parallel to, each other and said principal plane.

2. In a printed circuit board, a signal bus comprising:

a plurality of substantially parallel signal lines on said printed circuit board, each signal line having substantially the same electrical length as the other signal lines and forming a loop in two halves, each half electrically shielded from the other half by an isolation line referenced to an AC ground potential, each signal line further having first and second terminals, each terminal connected to a reference bias voltage through a first resistance.

3. The signal bus of claim 2 wherein said first resistance matches a loaded characteristic impedance of said each signal line.

4. The signal bus of claim 3 wherein said first resistance is approximately one-half of the unloaded characteristic impedance of said each signal line.

5. In a printed circuit board, a signal bus comprising:

a plurality of substantially parallel signal lines on said printed circuit board, each signal line having substantially the same electrical length as the other signal lines and forming a loop in two halves, each signal line further having first and second terminals, each terminal connected to a reference bias voltage through a first resistance, said reference bias voltage being set at a midpoint of signal voltage swings on said each signal line.

6. In a printed circuit board, a signal bus comprising:

a plurality of substantially parallel signal lines on said printed circuit board, each signal line having substantially the same electrical length as the other signal lines and forming a loop in two halves, each signal line further having first and second terminals, each terminal connected to a reference bias voltage through a first resistance, each signal line having a plurality of taps, each tap for connection to one of a plurality of integrated circuit devices mounted to said printed circuit board, each tap connected to an integrated circuit device located on an opposite loop half as that of the tap connected to an adjacent integrated circuit device.

7. In a printed circuit board, a signal bus comprising:

a plurality of substantially parallel signal lines on said printed circuit board, each signal line having substantially the same electrical length as the other signal lines and forming a loop in two halves, each signal line further having first and second terminals, each terminal connected to a reference bias voltage through a first resistance, wherein each signal line has a plurality of taps, each tap for connection through a stub to one of a plurality of integrated circuit devices mounted to said printed circuit board, said stub having a second resistor in series connection with a remainder of said stub.

8. The signal bus of claim 7 wherein said second resistor has a resistance in the range of 20 to 30 ohms.

9. A printed circuit board system comprising:

an insulating substrate;

a memory controller integrated circuit device mounted to said insulating substrate;

a plurality of memory integrated circuit devices mounted to said insulating substrate;

a plurality of signal lines interconnecting said memory integrated circuit controller device and said one memory integrated circuit device, each signal line having substantially the same electrical length as said other signal lines and forming a loop in two halves, each half electrically shielded from the other half by an isolation line referenced to an AC ground potential, each signal line further having first and second terminals, each terminal connected to a reference bias voltage through a first resistance.

10. The printed circuit board system of claim 9 wherein said insulating substrate comprises a plurality of insulating layers, each half of each signal line disposed in a different insulating layer from that of the other half of said signal line.

11. The printed circuit board system of claim 9 wherein said first resistance matches a loaded characteristic impedance of said each signal line.

12. The signal bus of claim 11 wherein said first resistance is approximately one-half of the unloaded characteristic impedance of said each signal line.

13. The signal bus of claim 11 wherein said reference bias voltage is set at a midpoint of signal voltage swings on said each signal line.

14. The printed circuit board system of claim 9 wherein each signal line has a plurality of taps, each tap for connection to one of said memory integrated circuit devices, said plurality of memory integrated circuit devices being located parallel to said signal line, each tap connected to a memory integrated circuit device located on a loop half opposite to that of a tap connected to an adjacent memory integrated circuit device.

15. The printed circuit board system of claim 9 wherein each signal line has a plurality of taps, each tap for connection through a stub to one of said memory integrated circuit devices mounted to said printed circuit board, said stub having a second resistor in series connection with a remainder of said stub.

16. The printed circuit board system of claim 15 wherein said second resistor has a resistance in the range of 20 to 30 ohms.

* * * * *